US012467138B2

(12) United States Patent
Xing et al.

(10) Patent No.: US 12,467,138 B2
(45) Date of Patent: Nov. 11, 2025

(54) GAS CONVEYING ASSEMBLY AND GAS-PHASE REACTION DEVICE

(71) Applicant: Chuyun Tek (Shanghai) Co., Ltd., Shanghai (CN)

(72) Inventors: Zhigang Xing, Shanghai (CN); Zhiming Zhang, Shanghai (CN); Lei Liu, Shanghai (CN)

(73) Assignee: Chuyun Tek (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 18/373,932

(22) Filed: Sep. 27, 2023

(65) Prior Publication Data

US 2024/0240313 A1 Jul. 18, 2024

(30) Foreign Application Priority Data

Sep. 30, 2022 (CN) ........................ 202211208815.X

(51) Int. Cl.
*C23C 16/455* (2006.01)
*C23C 16/458* (2006.01)

(52) U.S. Cl.
CPC .. *C23C 16/45508* (2013.01); *C23C 16/45561* (2013.01); *C23C 16/45565* (2013.01); *C23C 16/4584* (2013.01)

(58) Field of Classification Search
None
See application file for complete search history.

(56) References Cited

U.S. PATENT DOCUMENTS 5,134,965 A * 8/1992 Tokuda ............. H01J 37/32192 204/298.31
6,302,965 B1 * 10/2001 Umotoy ............ C23C 16/45576 118/715

(Continued)

FOREIGN PATENT DOCUMENTS

CN 105200395 Y 12/2015
CN 107447205 A * 12/2017 ......... C23C 16/4551

(Continued)

OTHER PUBLICATIONS

English Machine translation of Chen (CN107447205A) retrieved from ESPACENET Aug. 13, 2024 (Year: 2024).*

(Continued)

*Primary Examiner* — Parviz Hassanzadeh
*Assistant Examiner* — Laureen Chan
(74) *Attorney, Agent, or Firm* — IPRTOP LLC

(57) ABSTRACT

A gas delivery assembly and gas-phase reaction apparatus; the gas delivery assembly includes an internal gas delivery assembly in a central region of the gas delivery assembly and a peripheral gas delivery assembly surrounding the central region. The peripheral gas delivery assembly includes tubular channels and annular grooves communicating with the tubular channels to allow gas outflow from the tubular channels; for some tubular channels, there exists a non-zero angle φ between the main axis and a projection of its tube axis on the tangent plane with respect to the main axis, so that the gas outflow from the peripheral gas delivery assembly constitutes a rotary gas flow, and the rotation direction of the rotary gas flow is the same as that of the susceptor during reaction, thereby suppressing or eliminating vortices.

16 Claims, 10 Drawing Sheets

(56) References Cited

U.S. PATENT DOCUMENTS

| | | | | |
|---|---|---|---|---|
| 2003/0140851 | A1* | 7/2003 | Janakiraman | C23C 16/45565 438/758 |
| 2009/0084317 | A1 | 4/2009 | Wu et al. | |
| 2013/0299009 | A1* | 11/2013 | Jiang | C23C 16/45572 137/15.01 |
| 2014/0158786 | A1* | 6/2014 | Santo | C23C 16/45565 239/548 |
| 2015/0176126 | A1 | 6/2015 | Ge et al. | |
| 2015/0368799 | A1 | 12/2015 | Jiang et al. | |
| 2016/0369395 | A1* | 12/2016 | Liang | C23C 16/45563 |
| 2017/0002463 | A1* | 1/2017 | Fan | C23C 16/45525 |
| 2017/0256418 | A1 | 9/2017 | Chang et al. | |
| 2019/0304751 | A1* | 10/2019 | Park | H01J 37/32715 |

FOREIGN PATENT DOCUMENTS

| | | | | |
|---|---|---|---|---|
| CN | 107447205 | Y | 12/2017 | |
| CN | 108103479 | A * | 6/2018 | C23C 16/45544 |
| CN | 108103479 | Y | 6/2018 | |
| CN | 215288962 | A | 12/2021 | |
| CN | 215815786 | U * | 2/2022 | |
| CN | 114164412 | A | 3/2022 | |
| JP | H09293681 | A | 11/1997 | |
| JP | H10177959 | A | 6/1998 | |
| JP | 2019075516 | A | 5/2019 | |
| KR | 100892754 | A | 4/2009 | |
| WO | 2015183483 | A | 12/2015 | |
| WO | 2021257462 | A | 12/2021 | |

OTHER PUBLICATIONS

English Machine translation of Lin (CN108103479A) retrieved from ESPACENET Aug. 13, 2024 (Year: 2024).*

English Machine Translation of Wu et al. (CN215815786U) retrieved from ESPACENET Aug. 21, 2024 (Year: 2024).*

* cited by examiner

GAS CONVEYING ASSEMBLY AND GAS-PHASE REACTION DEVICE

CROSS REFERENCE TO RELATED APPLICATION

The present application claims the benefit of priority to Chinese patent application Ser. No. 20/2211208815. X, entitled "GAS DELIVERY ASSEMBLY AND GAS-PHASE REACTION APPARATUS", filed with CNIPA on Sep. 30, 2022, the disclosure of which is incorporated herein by reference in its entirety for all purposes.

TECHNICAL FIELD

The present disclosure relates to the technical field of semiconductor apparatus, and in particular to a gas delivery assembly and a gas-phase reaction apparatus.

DESCRIPTION OF RELATED ART

Statements of the present section serves to provide background information of the present disclosure and do not necessarily constitute prior art.

The reaction chamber plays a pivotal role in the process of manufacturing semiconductor device. In the case of a gas phase reaction apparatus, the reaction chamber is where process gases are introduced to establish a flow field. During the reaction process to generate target film, the delivery of process gases into the reaction chamber and the removal of utilized gases and by-products from the reaction chamber are managed through a flow field. This flow field is jointly established by the carrier gases and the reactant gases.

The susceptor, which holds the substrate for reaction process to form film, typically rotates during the reaction process. Due to the rotation of the susceptor, the velocity of the gas flow which near the outer edge of the rotating susceptor has two components: a velocity along the direction of the central axis of the reaction chamber, and a tangential velocity caused by the drag from the rotating susceptor. The presence of this tangential velocity increases the total velocity of the gas flow in the region near the edge of the susceptor. This is particularly noticeable when the susceptor is rotating at high speeds, which can result in the formation of vortices in the region near the edge of the susceptor. These gas vortices can have several negative effects on the operation of the chamber, such as reducing the uniformity of the material grown on the substrate in and around the vortex area, and decreasing the stability of the growth environment and process within the chamber.

For the reaction chamber carrying gaseous reactants, during the actual reaction process, to suppress and even eliminate the vortices, the commonly used method is to adjust the distribution and morphology of the flow field by following three overall process parameters: total gas flow rate in the reaction chamber, pressure within the reaction chamber, and rotation speed of the susceptor. However, this method has its limitations and restrict the usable range of process parameters. Furthermore, this method often leads to an increase in the consumption of carrier gases and source material gases. This results in a decrease in the efficiency of process gases usage, leading to higher gas consumption and increased operation costs of gas phase reaction apparatus. Therefore, further improvements of gas phase reaction apparatus are still desirable.

SUMMARY

In a first aspect, the present disclosure provides a gas delivery assembly for a gas-phase reaction apparatus. The gas-phase reaction apparatus includes a susceptor, wherein the gas delivery assembly includes an internal gas delivery assembly located in a central region of the gas delivery assembly and a peripheral gas delivery assembly surrounding the central region, wherein:

the peripheral gas delivery assembly includes a plurality of tubular channels and at least one annular groove fluid communicating with the tubular channels to allow gas outflow from the tubular channels, and an opening side of the annular groove is a gas outlet side, which faces the susceptor, wherein a main axis of the gas delivery assembly is perpendicular to a plane containing the gas outlet side and passes through a geometric center of a gas outlet surface of the gas delivery assembly, a tube axis of each of the tubular channels intersects the annular groove at a point O, respectively, wherein a tangent plane is defined at the corresponding point O of each of the tubular channels with respect to the main axis, wherein for at least one of the tubular channels, there exists a non-zero angle φ between the main axis and a projection of its tube axis on the corresponding tangent plane at the point O, so that the gas outflow from the peripheral gas delivery assembly constitutes a rotary gas flow, and a rotation direction of the rotary gas flow is the same as a rotation direction of the susceptor during reaction.

Optionally, a cross section of the annular groove is conical, trapezoidal, rectangular, arcuate, or polygonal.

Optionally, the annular groove is a single annular groove, the tubular channels are distributed along at least one concentric annular region, and the tubular channels are in fluid communication with the single annular groove.

Optionally, the structure of annular groove includes several concentric annular grooves, the tubular channels are distributed along several concentric annular regions, the quantity of the concentric annular grooves is less than or equal to that of the concentric annular regions, and each of the concentric annular grooves is arranged corresponding to at least one of the concentric annular regions and communicates with the tubular channels in the corresponding at least one concentric annular region.

Optionally, the quantity of the tubular channels in each of the concentric annular regions is the same, or the outermost concentric annular region has more tubular channels than the innermost concentric annular region, or from the innermost concentric annular region to the outermost concentric annular region, the quantity of the tubular channels in each of the concentric annular regions gradually increases.

Optionally, each of the concentric annular grooves has a same opening width, or the opening width of the outermost concentric annular groove is greater than that of the innermost concentric annular groove, or from the innermost concentric annular groove to the outermost concentric annular groove, the opening width of each of the concentric annular grooves gradually increases; or an opening area of the outermost concentric annular groove is larger than that of the innermost concentric annular groove, or from the innermost concentric annular groove to the outermost concentric annular groove, the opening area of each of the concentric annular grooves gradually increases.

Optionally, at least some of the tubular channels have the same angle φ.

Optionally, the concentric annular grooves correspond one-to-one with the concentric annular regions, and each of the tubular channels in the same concentric annular region has the same angle φ.

Optionally, the angle φ of the tubular channels in the outermost concentric annular region is not smaller than that of the innermost concentric annular region, or from the innermost concentric annular region to the outermost concentric annular region, the angle φ of the tubular channels in each of the concentric annular regions gradually increases.

Optionally, for each point O, a straight line parallel to the main axis and passing through the point O is defined as an axial line OO' of the point O, and a plane containing the main axis and the axial line OO' is defined as a plane P0, and a plane containing the tube axis corresponding to the point O and the axial line OO' is defined as a vertical plane of the tube axis corresponding to the point O; wherein for at least one of the tubular channels, there exists an angle θ between the vertical plane corresponding to the tube axis and the tangent plane at the point O, and the annular groove where the point O is located intersects with the plane containing the gas outlet side, forming a first intersection line and a second intersection line, wherein the first intersection line intersects with the plane P0 at a point M, the second intersection line intersects with the plane P0 at a point N, an angle γ is formed between lines OM and ON, an angular bisector of the angle γ is defined as a line OQ, and an angle δ is formed between the line OQ and the axial line OO'; wherein at least one of the angle δ and the angle θ is not zero.

Optionally, the line OQ and the tube axis are both inclined in the same direction with respect to the main axis, and the angle δ is equal to the angle θ.

Optionally, gases delivered by the peripheral gas delivery assembly are from the same gas supply terminal, and the gases delivered by the peripheral gas delivery assembly are regulated in a centralized and unified manner.

Optionally, the gas-phase reaction apparatus includes at least one spacer that divides the peripheral gas delivery assembly into several sub-regions that are independent of each other, and gases delivered by at least two of the sub-regions are regulated independent of each other.

Optionally, the sub-regions are concentric annular, the flow rate of gases flowing into the outermost sub-region is not less than that of gases flowing into the innermost sub-region, and/or the average molecular weight of the gases flowing into the outermost sub-region is not less than that of the gases flowing into the innermost sub-region.

Optionally, the sub-regions are concentric annular, and from the innermost sub-region to the outermost sub-region, the flow rate and/or the average molecular weight of gases flowing into each of the sub-regions gradually increases.

Optionally, the peripheral gas delivery assembly covers outer regions of the susceptor and an area of the susceptor covered by the peripheral gas delivery assembly does not exceed 36% of a total area of the susceptor.

Optionally, the peripheral gas delivery assembly is located on the outside of the susceptor, and the susceptor is not covered at all by the peripheral gas delivery assembly.

Optionally, gases delivered by the internal gas delivery assembly include reaction source gases and carrier gases to generate a target product, gases delivered by the peripheral gas delivery assembly are one or more of purge gases, carrier gases, and reaction source gases, wherein different types of gases delivered by the peripheral gas delivery assembly do not react with each other, or the different types of gases delivered by the peripheral gas delivery assembly react with each other but do not generate the target product.

In a second aspect, a gas-phase reaction apparatus is provided. The gas-phase reaction apparatus includes:

a reaction chamber;

a susceptor, disposed within the reaction chamber, wherein a rotation speed of the susceptor during reaction is higher than 200 rpm; and the gas delivery assembly described in the first aspect, which is disposed facing to the susceptor.

As described above, the present disclosure has the following advantages:

the presently disclosed gas delivery assembly includes an internal gas delivery assembly located in the central region of the gas delivery assembly and a peripheral gas delivery assembly surrounding the central region; the peripheral gas delivery assembly includes a plurality of tubular channels and at least one annular groove communicating with the tubular channels to allow gas outflow from the tubular channels; for at least one of the tubular channels, there exists a non-zero angle φ between the main axis and a projection of its tube axis on the corresponding tangent plane at point O, so that the gas outflow from the peripheral gas delivery assembly constitutes a rotary gas flow, and the rotation direction of the rotary gas flow is the same as the rotation direction of the susceptor during reaction process. This rotary gas flow has tangential velocity and momentum, which reduces the relative velocity between the central-field gas flow and the edge-field gas flow in the reaction chamber. As a result, the flow field in the reaction chamber undergoes a smoother process of the gas flow collision and mixing and the gas streamline converging over the outer portion of the susceptor. This suppresses or eliminates the generation of vortices in the reaction chamber, making the laminar characteristics of the flow field in the reaction chamber more stable. At the same time, overall process parameters, such as total gas flow rate in the reaction chamber, pressure within the reaction chamber, and rotation speed of the susceptor, have a wider usable range. The expansion of the usable range of the above process parameters can further promote efficient use of process gases and reaction source gases, so the operation cost of gas phase reaction apparatus can be effectively reduced. Further, particle defects generated during the reaction process are reduced, which improves the yield of the product. The above effects are particularly obvious when the susceptor is rotating at a speed higher than 200 rpm.

The gas-phase reaction apparatus including the above-mentioned gas delivery assembly can reduce and suppress the generation of gas vortices, and obtain a uniform and stable gas flow field, thereby expanding the usable range of process parameters and improving the utilization rate of carrier gases and reaction source gases. Therefore, the operation cost of gas phase reaction apparatus can be effectively reduced.

REFERENCE NUMERALS

100 Gas Delivery Assembly
101 Internal Gas Delivery Assembly
1010 First Gas Delivery Channel
1010-1 First Slit
1010-2 Second Slit
102(102')(102") Peripheral Gas Delivery Assembly
1020(1020')(1020") Second Gas Delivery Channel
1020-1(1020'-1) Tubular Channel
1021 First Sub-Region
1022 Second Sub-Region
1023 Third Sub-Region
1024 First Side
1025 Second Side
1027(1027') Annular Groove
10271(10271') First Concentric Annular Groove
10272(10272') Second Concentric Annular Groove
10273(10273') Third Concentric Annular Groove
103 Spacer
200 Reaction Chamber
201 Susceptor
300 Gas Supply Terminal
301 Gas Supply Line

DETAILED DESCRIPTION

The embodiments of the present disclosure will be described below. Those skilled can easily understand other advantages and effects of the present disclosure according to the contents disclosed by the specification. The present disclosure can also be implemented or applied through other different exemplary embodiments. Various modifications or changes can also be made to all details in the specification based on different points of view and applications without departing from the spirit of the present disclosure.

In this detailed description, expressions such as "gases", "carrier gases", "purge gases", "reaction source gases", "reaction gases", "process gases", "group V hydride source gases", and so on, can each refer to gases of a single chemical composition, or a mixture of gases of different chemical compositions, which can be selected according to process requirements. The phrase "in fluid communication with" used to describe the relationship between two structures means that the connection between the two structures allows them to communicate with each other so that the fluid can flow from one structure to another.

First Embodiment

Figure 1:
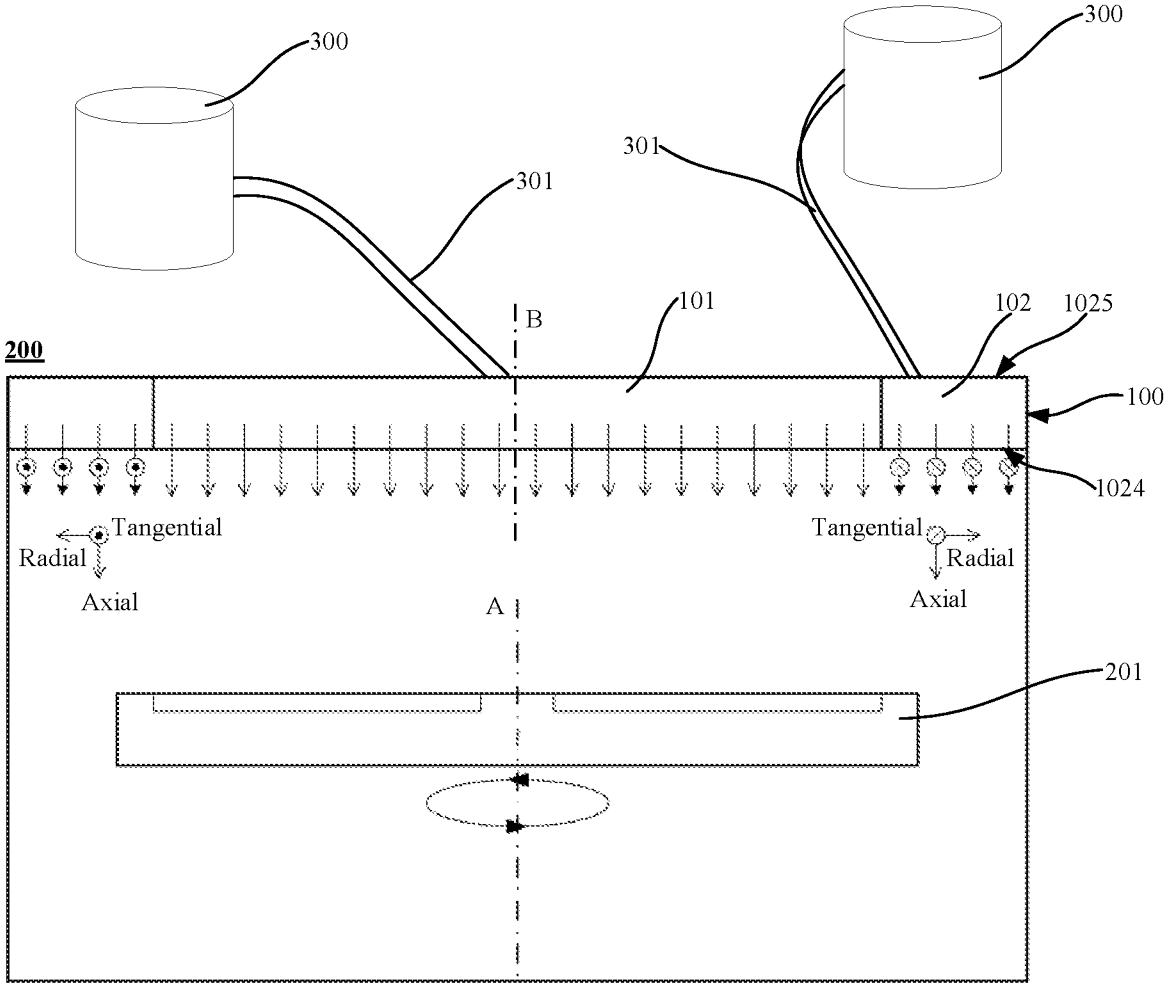
FIG. 1 is a schematic cross-sectional front view of a reaction chamber, which is part of a gas-phase reaction apparatus that includes a gas delivery assembly provided in an embodiment of the present disclosure.

This embodiment provides a gas delivery assembly for a gas-phase reaction apparatus. Referring to FIG. 1, the gas-phase reaction apparatus includes a reaction chamber 200 in which a susceptor 201 is disposed, and the gas delivery assembly 100 is disposed facing to the susceptor 201 (e.g., a bottom surface of the gas delivery assembly 100 faces a top surface of the susceptor 201) for delivering process gases into the reaction chamber 200. The gas-phase reaction apparatus is, for example, a vapor deposition apparatus, in particular, a chemical vapor deposition apparatus, a physical vapor deposition apparatus, a plasma enhanced vapor deposition apparatus, a metal organic chemical vapor deposition (MOCVD) apparatus, and the like. This embodiment is illustrated by taking the gas delivery assembly being a MOCVD apparatus as an example. It should be understood that the illustration is merely exemplary and does not restrict the scope of the present disclosure.

Referring to FIG. 1, the gas-phase reaction apparatus of the present embodiment has a reaction chamber 200, and the reaction chamber 200 of the gas-phase reaction apparatus typically has a cross-section that is circular or nearly circular in shape. In some embodiments, the reaction chamber 200 has a rectangular shape or any other structure that is commonly known to those skilled in this field. In some embodiments, the reaction chamber 200 is a vertical-flow chamber, or a horizontal-flow chamber. In some embodiments, the reaction chamber 200 is a face-up chamber in which the gas delivery assembly 100 is above the susceptor 201 and facing to the susceptor 201, so that gases were introduced from the top of the reaction chamber 200 and blow onto the surfaces of substrates in the direction of the axis of the reaction chamber 200. In some embodiments, the reaction chamber 200 is a face-down chamber in which the gas delivery assembly 100 is facing to the susceptor 201 and the susceptor 201 is above the gas delivery assembly 100, so that gases were introduced from the bottom of the chamber 200 and then blow onto the surfaces of substrates in the direction of the axis of the reaction chamber 200. For ease of description, the gas delivery assembly 100 hereinafter is exemplarily a face-up vertical-flow chamber in which the reaction chamber 200 shown in FIG. 1 is circular in cross-section and the gas delivery assembly 100 is above the susceptor 201.

Referring to FIG. 1, the susceptor 201 for carrying one or more substrates to be processed is provided in the reaction chamber 200, which rotates about a rotation axis A during vapor deposition. The gas delivery assembly 100 is disposed facing to the susceptor 201, the gas delivery assembly 100 is disposed, for example, at the top of the reaction chamber 200 to introduce process gas into the reaction chamber 200, and the susceptor 201 is located below the gas delivery assembly 100. The gas delivery assembly 100 as a whole has a disc-like shape, and the gas delivery assembly 100 includes an internal gas delivery assembly 101 that delivers a first gas, and a peripheral gas delivery assembly 102 that delivers a second gas. In some embodiments, the internal gas delivery assembly 101 is located in a central region of the gas delivery assembly 100, and the peripheral gas delivery assembly 102 is located in a peripheral region of the gas delivery assembly 100, and surrounds the internal gas delivery assembly 101. Still referring to FIG. 1, the gas-phase reaction apparatus further includes a gas supply terminal 300 arranged to supply process gases and a gas supply line 301, where the gas supply terminal 300 is connected to the gas delivery assembly 100 through the gas supply line 301, for supplying the first gas to the internal gas delivery assembly 101 and the second gas to the peripheral gas delivery assembly 102. In some embodiments, during the gas phase reaction process, the average molecular weight of the second gas is greater than or equal to the average molecular weight of the first gas.

Still referring to FIG. 1, the peripheral gas delivery assembly 102 has a first side 1024 and a second side 1025 opposite to the first side 1024, and the first side 1024 is a gas outlet surface of the peripheral gas delivery assembly 102, and faces the susceptor 201. Likewise, the internal gas delivery assembly 101 also has a gas outlet surface facing the susceptor 201. A main axis B is defined that the main axis B is perpendicular to a plane containing the first side 124 of the peripheral gas delivery assembly 102 (which is deemed equivalent to the gas outlet surface of the disc-shaped gas delivery assembly 100) and passes through a geometric center of the gas outlet surface of the gas delivery assembly 100. The main axis B is parallel to the rotation axis A of the susceptor 201. In some embodiments, the main axis B is not parallel to the rotation axis A of the susceptor 201. In some embodiments, the main axis B coincides with the rotation axis A.

Figure 2:
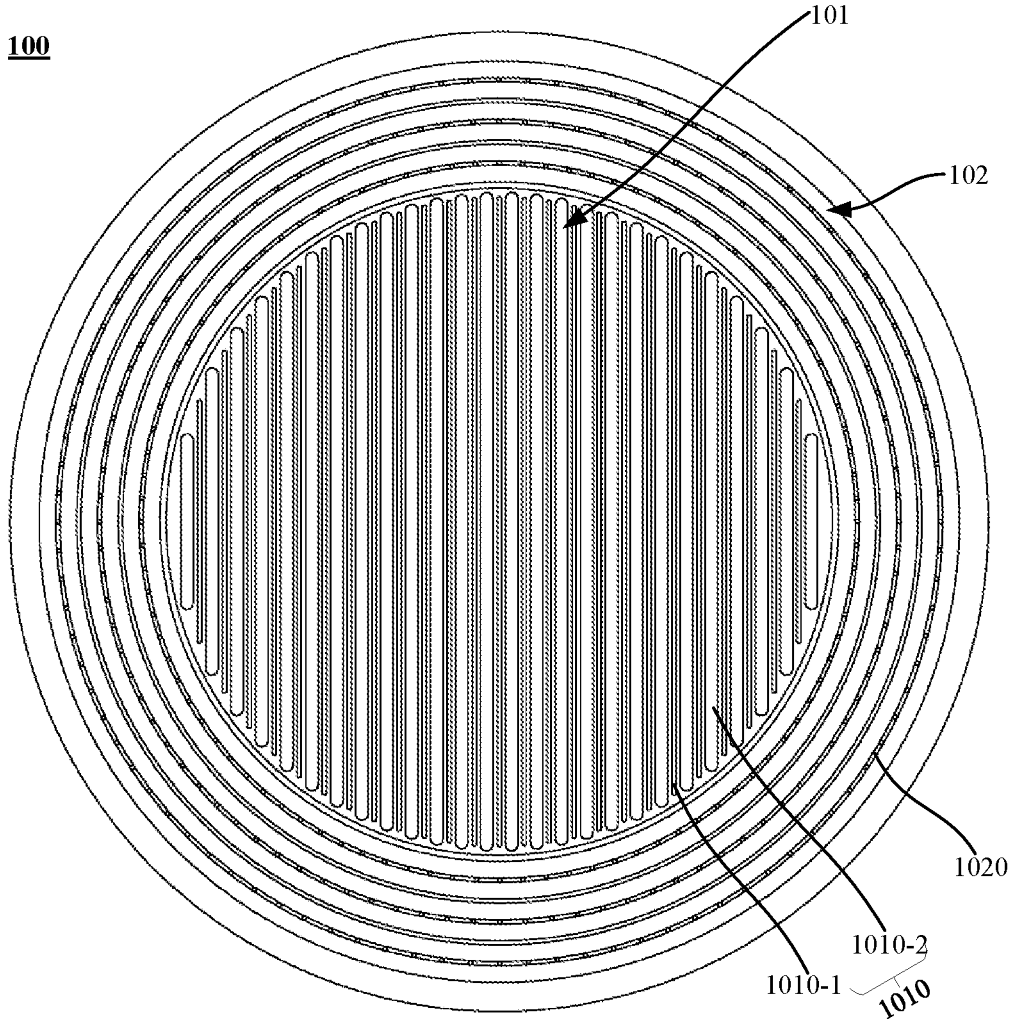
FIG. 2 is a schematic bottom view of the gas delivery assembly in FIG. 1.

FIG. 2 is a schematic bottom view of the gas delivery assembly 100. In the present disclosure, a "bottom view" corresponds to a viewing direction from the first side 1024 to the second side 1025, and a "top view" corresponds to a viewing direction from the second side 1025 to the first side 1024.

Referring to FIG. 2, the internal gas delivery assembly 101 includes several first gas delivery channels 1010 distributed within the internal gas delivery assembly 101. In some embodiments, the first gas delivery channels 1010 include slit-like channels extending in the same direction. During the gas phase reaction, the first gas includes a reaction source gas typically in admixture with a carrier gas. The reaction source gas refers to "a gaseous substance that participates in a vapor deposition reaction to form a film and is associated with the composition of that film". In some embodiments, for group III-V MOCVD, the first gas includes group III metal organic source gases, group V hydride source gases, and carrier gases. The first gas delivery channels 1010 include first slits 1010-1 for delivering the group III metal organic source gases and carrier gases to a gas phase reaction region, and second slits 1010-2 for delivering the group V hydride source gases and carrier gases to the gas phase reaction region, thereby causing a reaction between the group III metal organic source gases and the group V hydride source gases on the to-be-processed substrate to form a group III-V compound.

In some embodiments, the first slits 1010-1 and the second slits 1010-2 are alternately arranged in the internal gas delivery assembly 101. In some embodiments, one or more third slits are also included between the alternately arranged first slits 1010-1 and second slits 1010-2, and the carrier gases (or purge gases), which does not contain or could be inert with the reaction source gases, flows out of the third slits.

Figure 3:
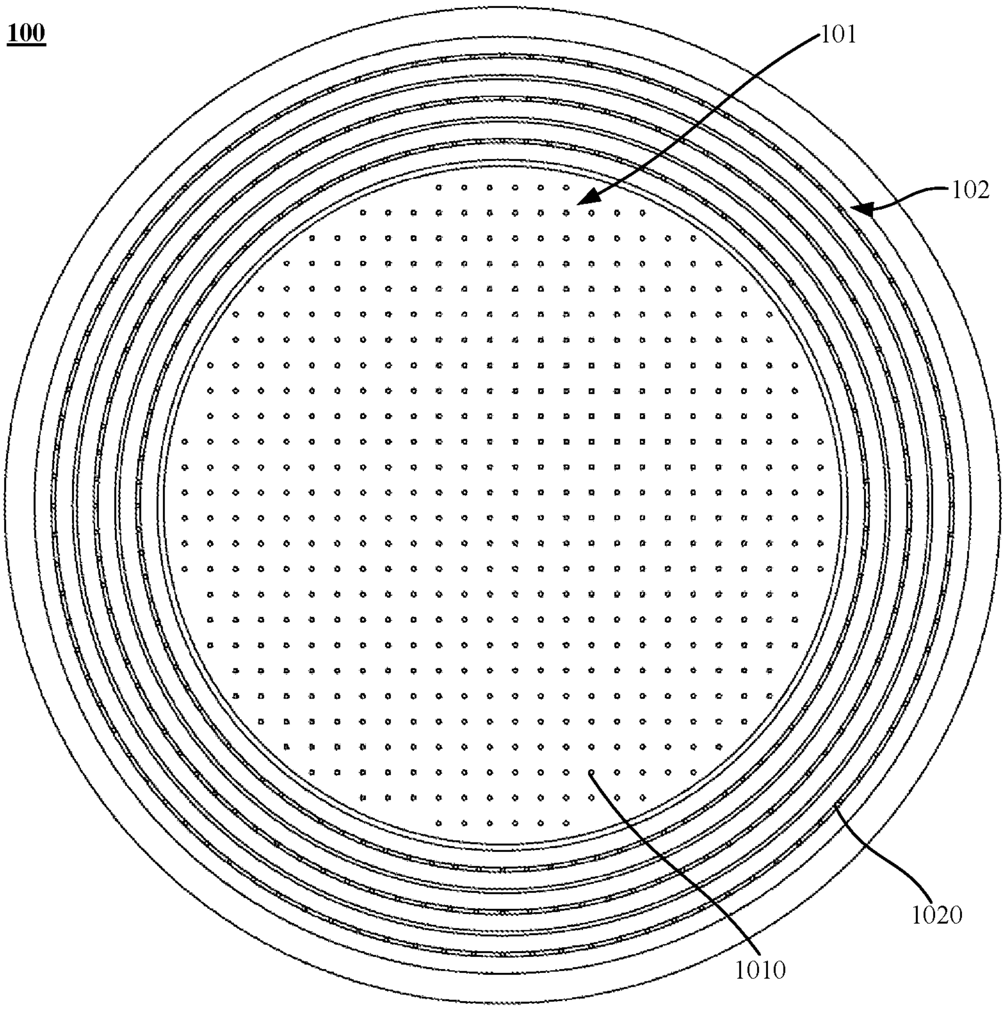
FIG. 3 is a schematic bottom view of the gas delivery assembly in an optional embodiment.

In some embodiments, referring to FIG. 3, the first gas delivery channels 1010 are holes, for example, circular holes, elliptical holes, diamond-shaped holes, or the like. These holes as a whole are arranged to resemble concentric rings, spaced-apart strips, or fans. In some embodiments, these holes are staggeringly arranged as several groups of holes. Shapes of the individual holes and distribution of the first gas delivery channels 1010 are adjusted by the person skilled in the art according to the actual process needs.

In some embodiments, the first gas delivery channels 1010 include both slits and holes, wherein the distribution, shape, and positional relationship of the slits and holes are adjusted according to actual process needs.

In some embodiments, the gas flow direction of the first gas injected into the reaction chamber 200 from the first gas delivery channels 1010 is substantially parallel to the main axis B, that is, the first gas delivery channels 1010 are vertical gas flow channels, and the gas flow direction is perpendicular to the susceptor 201.

In this embodiment, the peripheral gas delivery assembly 102 includes second gas delivery channels 1020 for delivering the second gas, which could be one or more of purge gases, carrier gases, and reaction source gases; in some embodiments, compositions of the second gas do not react with each other or do not generate the target product while reacting with each other. In some embodiments for comparison, all the various reaction source gases involved in the reaction go through the peripheral gas delivery assembly 102, there will be unnecessary material growth (such as group III-V compound unnecessarily formed on internal walls of the reaction chamber 200), wasting the reaction source gases, shortening the maintenance cycle of the gas-phase reaction apparatus, and some of the reaction source gases will enter into an internal gas phase reaction region, affecting the uniformity of the material growth. In the present disclosure, compositions of the second gas (which go through the second gas delivery channels 1020) do not react with each other, so the above problems can be effectively avoided, improving the uniformity of the material growth. In some embodiments, for group III-V MOCVD, the second gas may include group V hydride source gases in admixture with carrier gases or purge gases.

Figure 4:
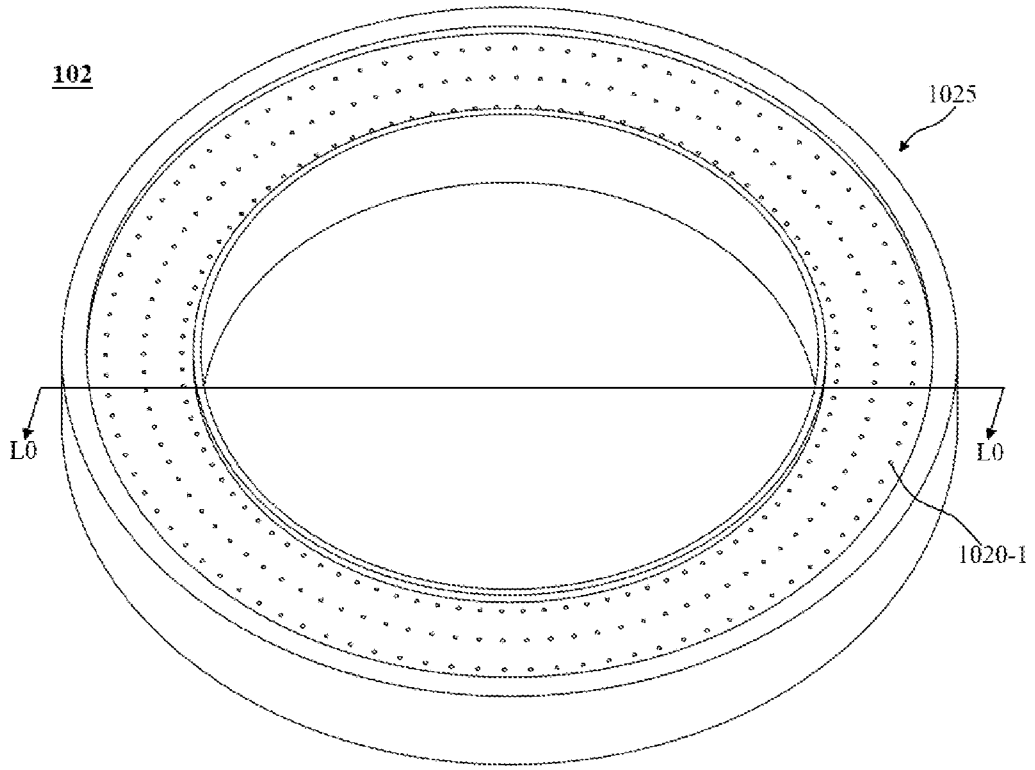
FIG. 4 is a three-dimensional top-view structural diagram of a peripheral gas delivery assembly of the gas delivery assembly shown in FIG. 1.
Figure 5:
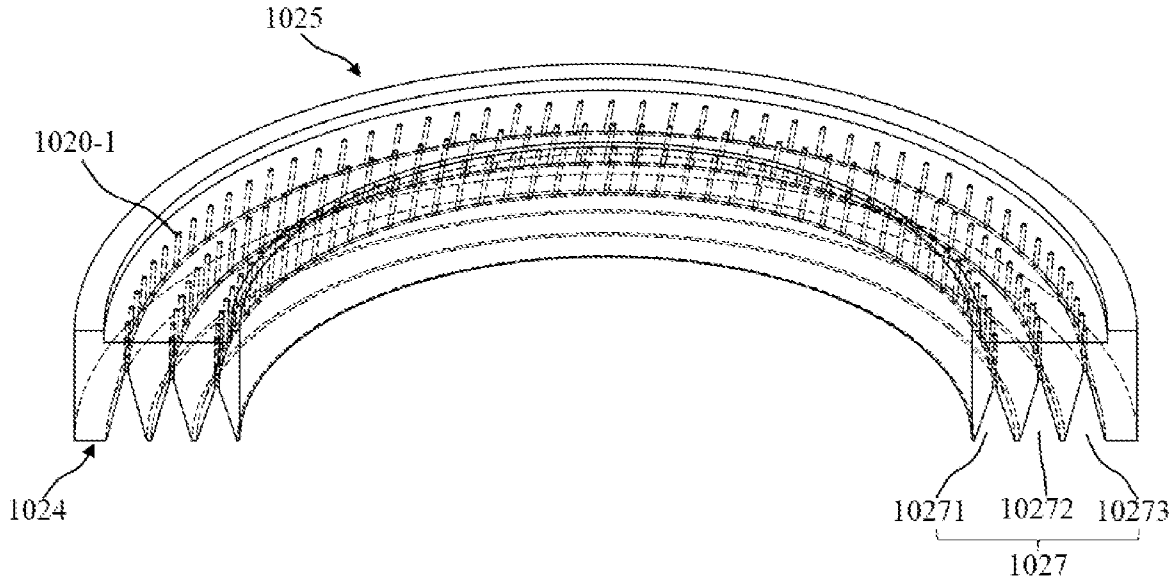
FIG. 5 is a top-down transparent perspective diagram of the peripheral gas delivery assembly, including a cross-section thereof with the cutting plane passing through the line L0-L0 in FIG. 4.

As shown in FIGS. 4-8, the second gas delivery channels 1020 include a plurality of tubular channels 1020-1 and at least one annular groove 1027, wherein the at least one annular groove 1027 is in fluid communication with the tubular channels 1020-1 to allow gas outflow from the tubular channels 1020-1, and an opening side (i.e., the side far away from the tubular channels) of the annular groove 1027 is a gas outlet side, which faces the susceptor 201. A cross section of each of the at least one annular groove 1027 along a thickness direction of the peripheral gas delivery assembly 102 is conical, trapezoidal, rectangular, arcuate, or polygonal. In some embodiments, the annular grooves 1027 in the same peripheral gas delivery assembly 102 have cross-sections with the same shape. Referring to FIG. 5, the tubular channels 1020-1 extend from the second side 1025 of the peripheral gas delivery assembly 102 to the first side 1024 of the peripheral gas delivery assembly 102.

Referring to FIG. 4, the tubular channels 1020-1 may be distributed in the peripheral gas delivery assembly 102 in any manner; In some embodiments, the tubular channels

1020-1 as a whole are arranged to resemble rings, or sector rings. In some embodiments, the tubular channels 1020-1 are collectively arranged to resemble rings. In some embodiments, the tubular channels 1020-1 are arranged to resemble concentric rings. That is, the tubular channels 1020-1 are distributed along several concentric annular regions. The quantity of tubular channels 1020-1 in each of the concentric annular regions is the same. In some embodiments, the quantity of tubular channels 1020-1 in the outermost annular region among the concentric annular regions is greater than the quantity of tubular channels 1020-1 in the innermost annular region among the concentric annular regions. In some embodiments, from the innermost annular region to the outermost annular region, the quantity of tubular channels 1020-1 in each of the concentric annular regions gradually increases. In some embodiments, from the innermost annular region to the outermost annular region, the quantity of tubular channels increases, and there are at least two adjacent annular regions that have the same quantity of tubular channels 1020-1. The specific distribution of the quantity of the tubular channels 1020-1 depends on the reaction process requirements. In some embodiments, referring to FIG. 4, the tubular channels 1020-1 are distributed along three concentric annular regions, including an inner annular region, a middle annular region, and an outer annular region, and the quantity of tubular channels in the three regions are respectively N1, N2, N3, wherein $N1=N2=N3$; or $N3>N1$, $N1 \leq N2 \leq N3$.

In some embodiments, the quantity of the at least one annular groove 1027 is one or more.

In some embodiments, the annular groove is a single annular groove, that is, the quantity of the at least one annular groove 1027 is one, this annular groove 1027 is in fluid communication with all the tubular channels 1020-1 in the peripheral gas delivery assembly 102, that is to say this annular groove 1027 is connected to all the tubular channels 1020-1 so that gases could flow between this annular groove 1027 and each tubular channel 1020-1. The tubular channels 1020-1 are distributed along one annular region or several concentric annular regions.

In some embodiments, the structure of annular groove 1027 includes several concentric annular grooves; in some embodiments, referring to FIG. 5, the annular groove 1027 includes a first concentric annular groove 10271, a second concentric annular groove 10272, and a third concentric annular groove 10273. The tubular channels 1020-1 are distributed along the several concentric annular regions, and each of the three concentric annular grooves of the annular groove 1027 corresponds to at least one concentric annular region such that each of the three concentric annular grooves communicates with each tubular channel 1020-1 in the concentric annular region correspondingly. In some embodiments, the quantity of the concentric annular grooves of the annular groove 1027 is the same as the quantity of the concentric annular regions, and each concentric annular groove of the annular groove 1027 corresponds to one of the concentric annular regions, that is, the concentric annular grooves of the annular groove 1027 and the concentric annular regions are in a one-to-one correspondence; each concentric annular groove of the annular groove 1027 is in fluid communication with each tubular channel 1020-1 distributed along the one corresponding concentric annular region, and the tubular channels 1020-1 distributed along each concentric annular region resemble one or more rings. In some embodiments, the quantity of the concentric annular grooves of the annular groove 1027 is different from the quantity of the concentric annular regions; for example, the quantity of the concentric annular grooves of the annular groove 1027 is plural and less than the quantity of the concentric annular regions, with each of the concentric annular grooves of the annular groove 1027 corresponding to at least one of the concentric annular regions such that each concentric annular groove of the annular groove 1027 is in fluid communication with tubular channels in a corresponding concentric annular region; In some embodiments, at least two adjacent concentric annular regions of the several concentric annular regions are in fluid communication with one concentric annular groove of the annular groove 1027, and the remaining concentric annular regions are in one-to-one fluid communication with the remaining concentric annular grooves of the annular groove 1027.

In some embodiments, each of the concentric annular grooves of the annular groove 1027 has a same opening width; or the opening width of the outermost concentric annular groove is greater than that of the innermost concentric annular groove; or the opening width of each of the concentric annular grooves gradually increases from the innermost concentric annular groove to the outermost concentric annular groove; or the opening width of each of the concentric annular groove increases from the innermost concentric annular groove to the outermost concentric annular groove, and at least two adjacent concentric annular grooves have the same opening width; or the opening area of the outermost annular concentric groove is larger than that of the innermost concentric annular groove; or the opening area of each of the concentric annular groove gradually increases from the innermost concentric annular groove to the outermost concentric annular groove; or the opening area of each of the concentric annular groove increases from the innermost concentric annular groove to the outermost concentric annular groove, and at least two adjacent concentric annular grooves have the same opening area. The specific structure of the annular groove 1027 depends on the process requirements.

Figure 8:
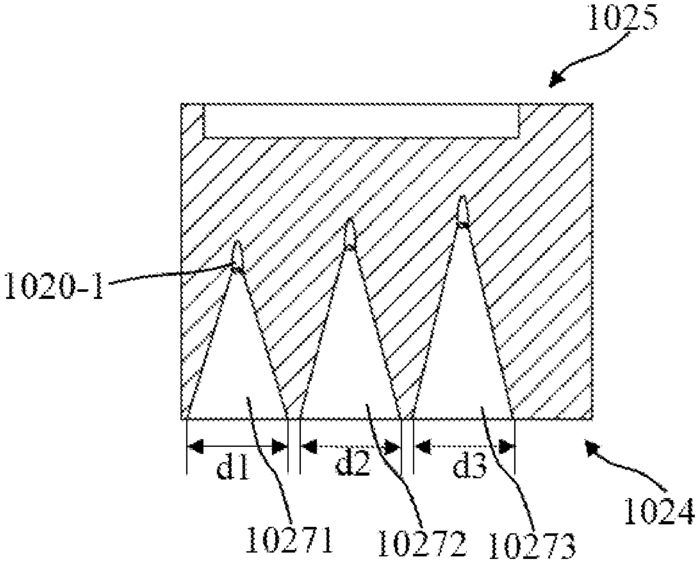
FIG. 8 is a schematic cross-sectional front view with the cutting plane passing through the line K-K in FIG. 6.

Referring to FIG. 5 and FIG. 8, in some embodiments, the tubular channels 1020-1 are distributed along three concentric annular regions, and the at least one annular groove 1027 includes three concentric annular grooves, starting from the innermost to the outermost: the first concentric annular groove 10271, the second concentric annular groove 10272, and the third concentric annular groove 10273. The first concentric annular groove 10271, the second concentric annular groove 10272, and the third concentric annular groove 10273 are in a one-to-one correspondence with the three concentric annular regions, and are each connected to tubular channels 1020-1 in the corresponding concentric annular region. The opening widths of the first concentric annular groove 10271, the second concentric annular groove 10272, and the third concentric annular groove 10273 are d1, d2, and d3, respectively; and the opening areas of the first concentric annular groove 10271, the second concentric annular groove 10272, and the third concentric annular groove 10273 are S1, S2, and S3, respectively; in some embodiments, referring to FIG. 8, the opening widths of the concentric annular grooves are the same, that is, $d1=d2=d3$; in some embodiments, $d3>d1$, $d1 \leq d2 \leq d3$; in some embodiments, $S3>S1$, $S1 \leq S2 \leq S3$.

Definitions: a tube axis of each of the tubular channels 1020-1 intersects the annular groove 1027 at a point O respectively, a tangent plane is defined at the corresponding point O of each of the tubular channels 1020-1 with respect to the main axis B; for at least one of the tubular channels 1020-1, there exists a non-zero angle φ between the main axis B and a projection (e.g., an orthogonal projection) of the tube axis of the tubular channel on the corresponding tangent plane at the point O, so that the gas outflow from the peripheral gas delivery assembly 102 constitutes a rotary gas flow, wherein the velocity of the rotary gas flow has a non-zero axial component and a non-zero tangential component, and the rotation direction of the rotary gas flow is the same as the rotation direction of the susceptor 201 during reaction.

Figure 6:
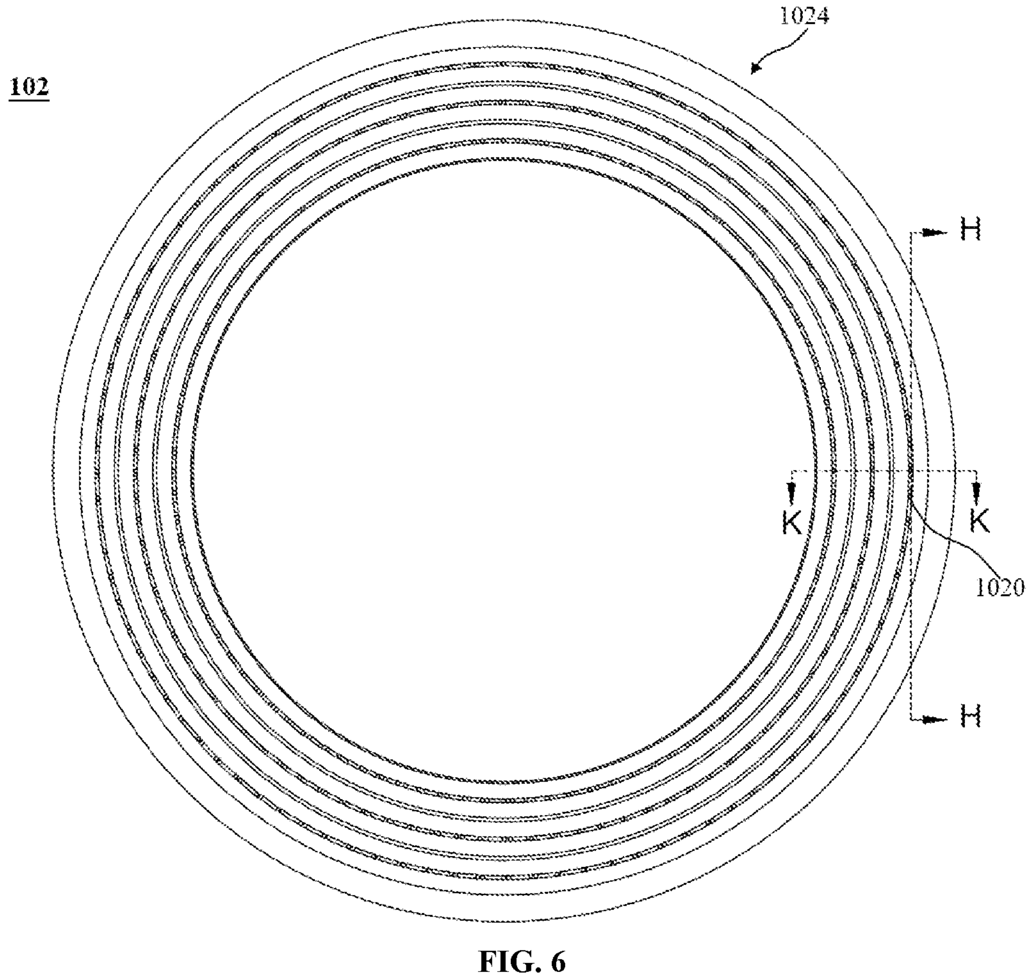
FIG. 6 is a schematic bottom view of the peripheral gas delivery assembly of the gas delivery assembly shown in FIG. 1.
Figure 7:
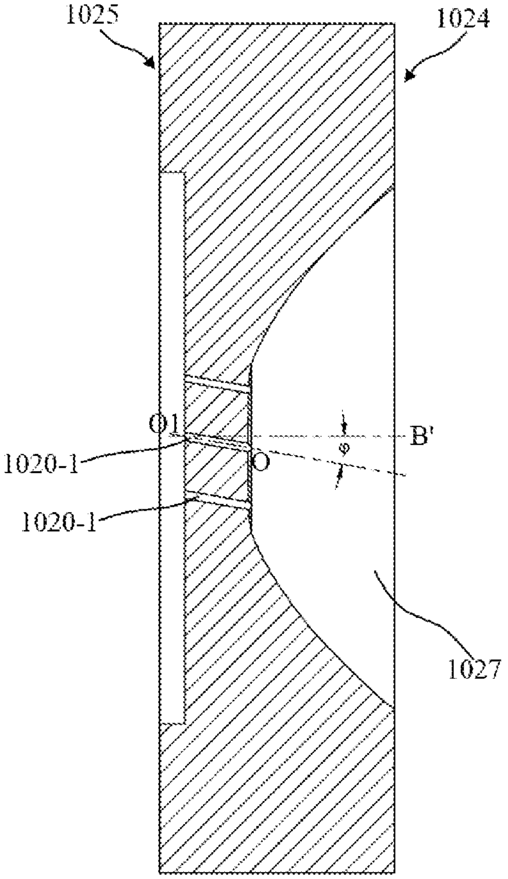
FIG. 7 is a schematic cross-sectional side view with the cutting plane passing through the line H-H in FIG. 6.

For ease of understanding, the following assumes that the tube axis of an exemplary tubular channel 1020-1 is included in the tangent plane at the point O of this exemplary tubular channel 1020-1. Referring to FIGS. 6 and 7, FIG. 7 is a schematic cross-sectional side view with the cutting plane passing through the line H-H in FIG. 6, and the cross-section of FIG. 7 is included in the tangent plane at the point O of this exemplary tubular channel 1020-1.

Referring to FIG. 7, in this embodiment, the tube axis of the exemplary tubular channel 1020-1 intersects the corresponding annular groove 1027 at the point O (that is, the lower end point of the tube axis), a point O1 is defined as the geometric center of an upper surface of the exemplary tubular channel 1020-1 closer to the second side 1025 of the peripheral gas delivery assembly 102 and also the other end point of the tube axis of the tubular channel 1020-1 (that is, the upper end point of the tube axis), so that the tube axis of the exemplary tubular channel 1020-1 is denoted as OO1, and the tangent plane at the point O of the exemplary tubular channel 1020-1 is defined as the tangent plane at the point O with respect to the main axis B. In this case, the projection of the tube axis OO1 of the exemplary tubular channel 1020-1 onto the tangent plane at the point O is the tube axis OO1 itself, at which time, for at least one of the tubular channels 1020-1, there exists a non-zero angle φ between the main axis B of the gas delivery assembly 100 (referring to FIG. 7, see the straight line O1B' parallel to the main axis B) and the tube axis OO1. That is, at least one of the tubular channels 1020-1 is inclined with respect to the main axis B. In some embodiments, the tubular channels 1020-1 in the peripheral gas delivery assembly 102 are all inclined relative to the main axis B; in some embodiments, some of the tubular channels 1020-1 are parallel to the main axis B and some of the tubular channels 1020-1 are inclined relative to the main axis B. Tubular channels 1020-1 inclined with respect to the main axis B cause gas outflow from the peripheral gas delivery assembly 102 to form a rotary gas flow, and the rotation direction of the rotary gas flow is the same as the rotation direction of the susceptor 201 during reaction process.

For more complicated cases where the tube axes of the tubular channels 1020-1 are not located on their respective tangent planes at the point O, as long as for some of the tubular channels 1020-1, there are angles between the main axis B and the projections of their respective tube axes onto the respective tangent planes at the point O, the velocity of the gas injected from the second gas delivery channels 1020 will include a non-zero axial component and a non-zero tangential component, thereby forming a rotary gas flow.

In general, the larger the angle φ, the greater the ratio of the tangential component to the axial component, and the more obvious the rotational characteristics of the rotary gas flow. However, the above ratio should not be too large, otherwise it will have a significant impact on the gas flow in the inner reaction region, which is not conducive to the uniform injection of process gas into the reaction chamber 200. In some embodiments, $5° \leq \varphi \leq 60°$.

The second gas provided by the gas supply terminal 300 flows into the reaction chamber 200 through the gas supply line 301 and the second gas delivery channels 1020, and at least some of the tubular channels 1020-1 and the annular groove 1027 of the second gas delivery channels 1020 are arranged such that a rotary gas flow is formed when the gas is injected from the annular groove 1027, and the direction of the rotary gas flow is the same as the rotation direction of the susceptor 201 during reaction. Since the susceptor 201 rotates during reaction process, the gas flow over the outer portion of the susceptor 201 has a tangential velocity due to the dragging of the susceptor (especially so when the susceptor rotates at a speed higher than 200 rpm), which collides and mixes with an incoming gas flow (generally an axial incoming gas flow), thereby generating vortices in the direction of the incoming gas flow over the outer portion of the 7, see susceptor 201. In some embodiments of the present disclosure, as the direction of the rotary gas flow is made to be the same as the rotation direction of the susceptor 201 during reaction process, the incoming gas flow over the outer portion of the 7, see susceptor 201 changes from an axial incoming gas flow to an incoming gas flow with a tangential velocity in the same direction as that of the tangential velocity of the gas flow at the edge of the susceptor, which reduces the relative velocity between the gas flow over the outer portion of the susceptor 201 and the incoming gas flow in the reaction chamber 200. As a result, the flow field in the reaction chamber 200 undergoes a smoother process of the gas flow collision and mixing and the gas streamline converging over the outer portion of the susceptor. This suppresses or eliminates the generation of vortices in the reaction chamber, making the laminar characteristics of the flow field in the reaction chamber more stable. If the direction of the rotary gas flow is inconsistent with the rotation direction of the susceptor 201, the relative velocity between the gas flow over the outer portion of the susceptor 201 and the incoming gas flow becomes larger, which can exacerbate the generation of vortices.

In some embodiments, the peripheral gas delivery assembly 102 is located on the outside of the susceptor 201, and the susceptor 201 is not covered at all by the peripheral gas delivery assembly 102, that is, the susceptor 201 is totally exposed by the peripheral gas delivery assembly 102; that is, an orthogonal projection of the peripheral gas delivery assembly 102 onto the plane containing the upper surface of the susceptor 201 is not in contact with the upper surface of the susceptor 201. In another alternative embodiment, by adopting the above-described second gas delivery channels 1020 that can generate a rotary gas flow, the peripheral gas delivery assembly 102 can also cover the outer regions of the susceptor 201, and the coverage area does not exceed 36% of the total area of the upper surface of the susceptor 201 (that is, the radius of the uncovered area along the radial direction of the susceptor 201 is greater than or equal to 80% of the radius of the susceptor 201). The lower surface of the peripheral gas delivery assembly 102 is projected onto the plane containing the upper surface of the susceptor 201 to form a bottom projection of the peripheral gas delivery assembly 102, and, the overlapping area of the area enclosed by the bottom projection of the peripheral gas delivery assembly 102 and the upper surface of the susceptor 201 (i.e., the side facing the peripheral gas delivery assembly 102) is defined as the radial coverage area of the susceptor 201. In some embodiments, the area other than the radial coverage area of the upper surface of the susceptor 201 is the aforesaid "the uncovered area along the radial direction of the susceptor 201", which have a circular or circular-like structure. In some embodiments, the radius of "uncovered area along the radial direction of the susceptor 201" refer to an equivalent radius. Under the premise of ensuring the growth uniformity of the effective growth area on the susceptor, the area of the susceptor covered by the peripheral gas delivery assembly 102 has increased (due to the fact that the peripheral gas delivery assembly 102 can also supply reaction source gas), which can reduce the waste of the reaction source gas and further improve the use efficiency of the reaction source. In some embodiments, the bottom projection of the peripheral gas delivery assembly 102 is an orthographic projection of the lower surface of the peripheral gas delivery assembly 102 onto the plane containing the upper surface of the susceptor 201.

In this embodiment, among the tubular channels 1020-1 inclined with respect to the main axis B, at least some have the same angle φ. When the peripheral gas delivery assembly 102 includes a plurality of concentric annular grooves, the tubular channels are distributed along a plurality of concentric annular regions, and the plurality of concentric annular grooves correspond one-to-one with the plurality of concentric annular regions. In some embodiments, each of the tubular channels 1020-1 in the same concentric annular region has the same angle φ. In some embodiments, all the tubular channels 1020-1 in all the concentric annular regions have the same angle φ; In some embodiments, the angle φ of the tubular channels 1020-1 in the outermost annular region is not smaller than that of the tubular channels 1020-1 in the innermost annular region. In some embodiments, from the innermost annular region to the outermost annular region, the angle φ of the tubular channels 1020-1 in each annular region gradually increases; or in some embodiments, from the innermost annular region to the outermost annular region, the angle φ of the tubular channels 1020-1 in each annular region increases, and the tubular channels 1020-1 in at least two adjacent annular regions have the same angle φ. In some embodiment, referring to FIG. 4, the tubular channels 1020-1 are distributed along three concentric annular regions, including the inner annular region, the middle annular region, and the outer annular region. The angles φ of the tubular channels 1020-1 in the three regions are φ1, φ2, and φ3, respectively, where $\varphi 1=\varphi 2=\varphi 3$; or $\varphi 3>\varphi 2>\varphi 1$; or $\varphi 3>\varphi 1$, and $\varphi 1 \leq \varphi 2 \leq \varphi 3$. The specific structure of the tubular channels 1020-1 (e.g., angle φ) can be designed according to different reaction chambers and process requirements to minimize vortices in the flow field near the edge of the susceptor 201.

The gas delivery assembly is illustrated by taking an upright vertical-flow chamber as an example. It should be understood that in any type of reaction chamber, as long as vortices may be generated due to the rotation of the susceptor, the gas delivery assembly of the present disclosure can be used to suppress or eliminate the vortices and balance the gas flow.

Second Embodiment

This embodiment provides a gas delivery assembly for a gas-phase reaction apparatus (for example, a vapor deposition apparatus). Same as the first embodiment referred to FIG. 1, the gas-phase reaction apparatus of this embodiment also includes a reaction chamber 200 in which a susceptor 201 is disposed, and the gas delivery assembly 100 is disposed facing to the susceptor 201 (e.g., a bottom surface of the gas delivery assembly 100 faces a top surface of the susceptor 201) for delivering process gases into the reaction chamber 200. The gas delivery assembly of this embodiment mainly differs from that of the first embodiment in the peripheral gas delivery assembly of the gas delivery assembly. Therefore, in this embodiment, referring to FIG. 9, only the peripheral gas delivery assembly 102' is shown, and the peripheral gas delivery assembly 102' also has several second gas delivery channels 1020' for delivering the second gas, which could be one or more of purge gases, carrier gases, and reaction source gases. Referring to FIGS. 9 to 12, the second gas delivery channel 1020' also includes a plurality of tubular channels 1020'-1 and at least one annular groove 1027' wherein the at least one annular groove 1027' is in fluid communication with the tubular channels 1020'-1 to allow gases outflow from the tubular channels 1020'-1. For at least one of the tubular channels 1020'-1, there exists a non-zero angle φ between the main axis B and a projection of its tube axis onto the corresponding tangent plane at its point O. In addition, the second gas delivery channels 1020' have the following features.

Figure 9:
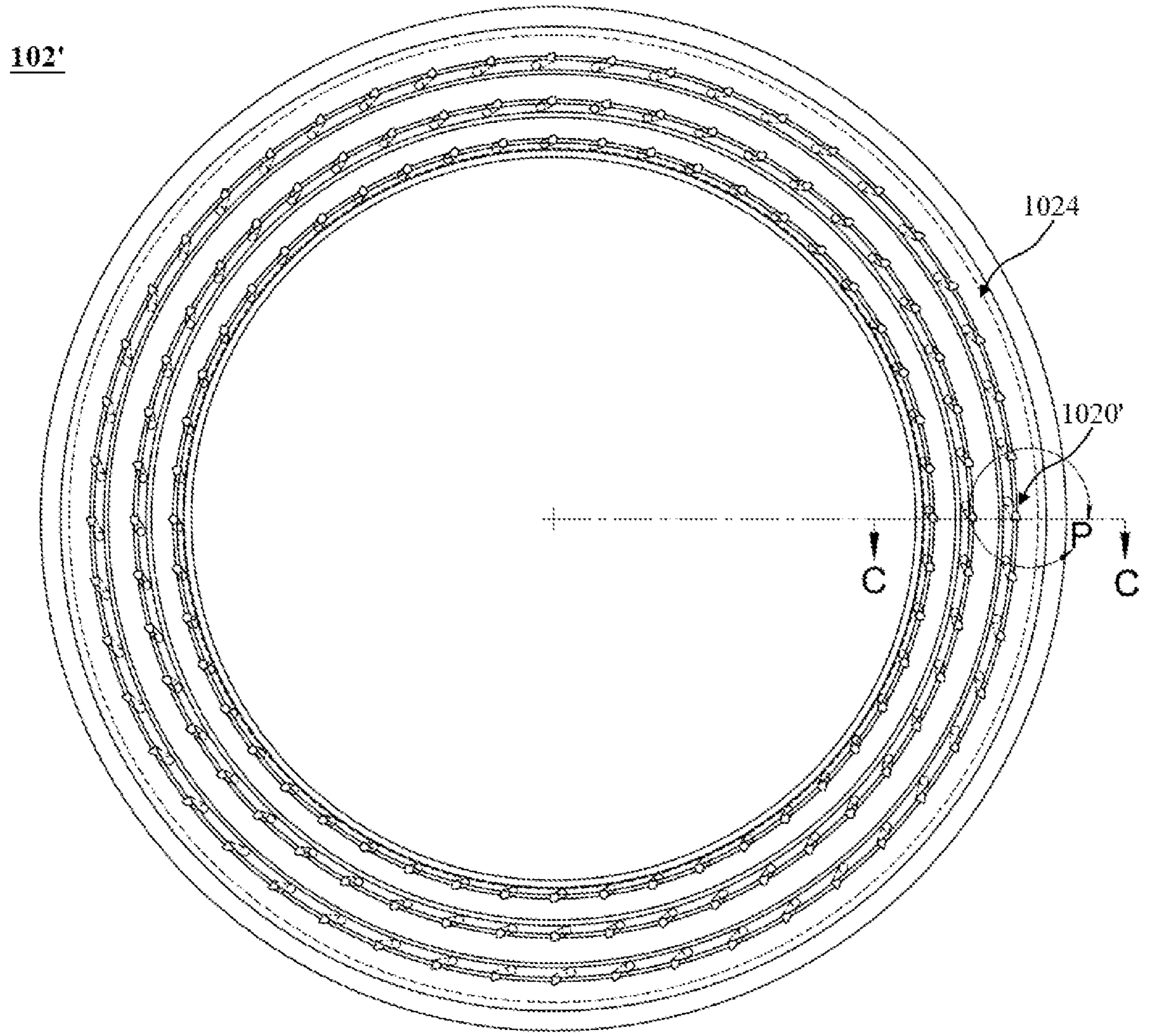
FIG. 9 is a bottom-view structural diagram of a peripheral gas delivery assembly of a gas delivery assembly according to an embodiment of the present disclosure, wherein some surfaces of the peripheral gas delivery assembly are rendered transparent to reveal details of tubular channels in the peripheral gas delivery assembly.
Figure 10:
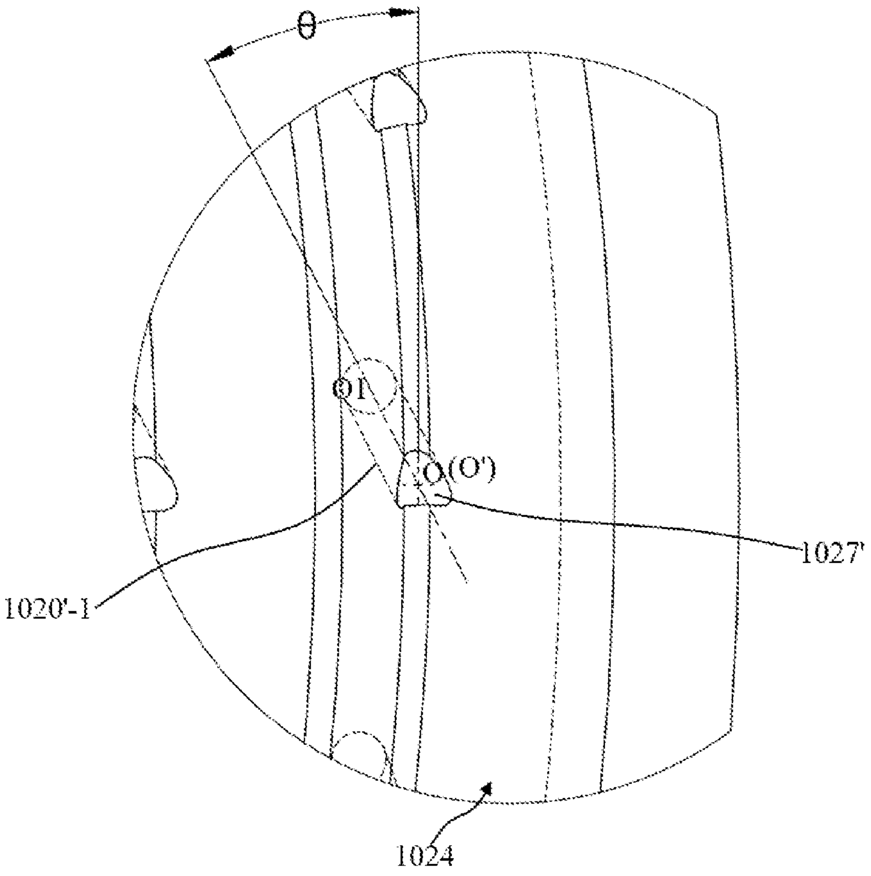
FIG. 10 is a partially enlarged view of Region P of FIG. 9.

Referring to FIG. 10, a partially enlarged view of Region P in FIG. 9 is shown. For at least one of the tubular channels 1020'-1, there exists an angle θ between a vertical plane in which its tube axis OO1 is located and a tangent plane at a corresponding point O; the point O is defined as an end point of the tube axis of the tubular channel 1020'-1 where the tubular channel 1020'-1 intersects the corresponding annular groove 1027' (that is, the lower end point of the tube axis); a point O1 is defined as the geometric center of an upper surface of the tubular channel 1020'-1 closer to the second side 1025 of the peripheral gas delivery assembly 102' and also the other end point of the tube axis of the tubular channel 1020'-1 (that is, the upper end point of the tube axis), so that the tube axis of the tubular channel 1020'-1 is denoted as OO1; an axial line OO' of the point O is defined as the straight line containing the point O and parallel to the main axis B. The vertical plane in which the tube axis OO1 of the tubular channel 1020'-1 is located is defined as the plane containing both the tube axis OO1 corresponding to the point O and the axial line OO'. The tangent plane at the point O of the tubular channel 1020-1 is defined as the tangent plane at the point O with respect to the main axis B, that is, the plane containing both a tangential line at the point O with respect to the main axis B, and the axial line OO'. The tangential line at the point O with respect to the main axis B is a line tangent to a circle containing the point O at the point O, and the main axis B passes through the center of this circle.

Figure 11:
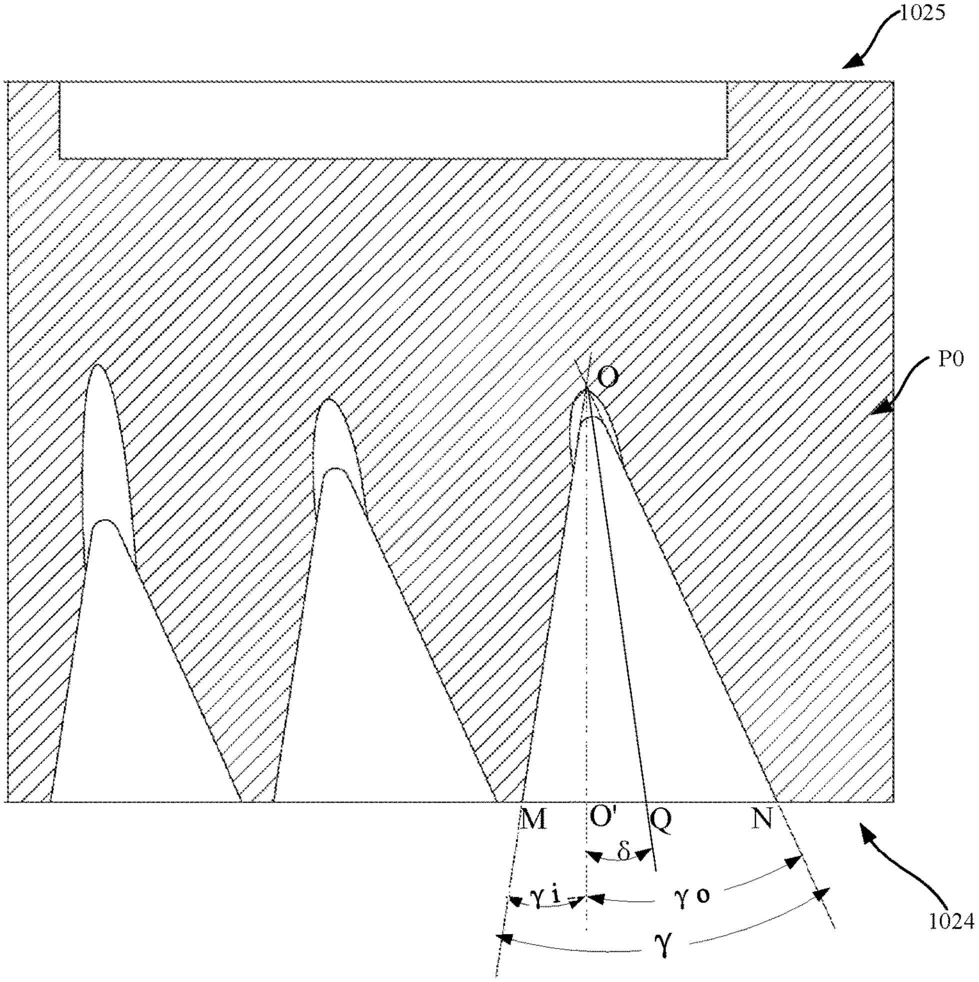
FIG. 11 is a schematic cross-sectional front view of the peripheral gas delivery assembly, with the cutting plane passing through line C-C in FIG. 9.
Figure 12:
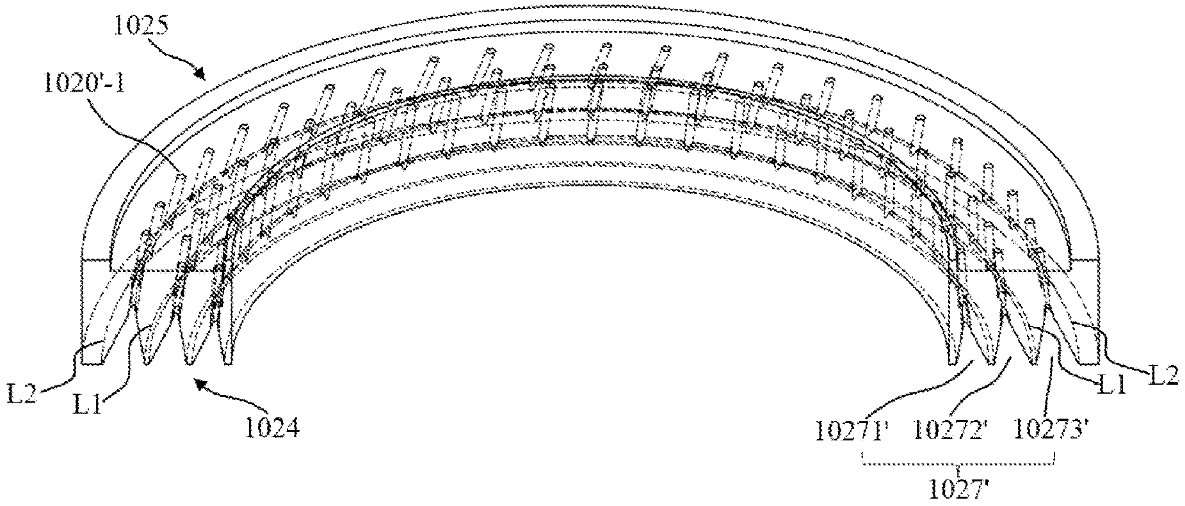
FIG. 12 is a top-down transparent perspective diagram of the peripheral gas delivery assembly in FIG. 9, including a cross-section thereof with the cutting plane passing through a diameter of the peripheral gas delivery assembly.

Referring to FIG. 11, and also referring to FIG. 12, each concentric annular groove of the annular groove 1027' where the point O is located intersects the plane containing the gas outlet side to form a first intersection line and a second intersection line. Taking the third concentric annular groove 10273' in FIG. 12 as an example, the third concentric annular groove 10273' intersects the plane containing the gas outlet side to form a first intersection line L1 and a second intersection line L2, while the plane containing both the main axis B and the axial line OO' is denoted a plane P0 (for example, the cross-section of the peripheral gas delivery assembly 102' shown in FIG. 11 along the line C-C in FIG. 9 is in the plane P0). The first intersection line L1 intersects with the plane P0 at a first intersection point M, the second intersection line L2 intersects with the plane P0 at a second intersection point N, and an angle γ is formed between lines OM and ON. An angular bisector of the angle γ is defined as a line OQ, and an angle δ is formed between the line OQ and the axial line OO', wherein at least one of the angle δ and the angle θ is not zero. In some embodiments, an angle γi is formed between the lines OM and OO', an angle γo is formed between the lines ON and OO', and the magnitude of δ is half of the difference Δγ between the angle γi and the angle γo. In some embodiments, the angle δ has the same magnitude as the angle θ, the tubular channels 1020'-1 and the annular groove 1027' are both inclined with respect to their respective tangent planes at respective points O, and the inclining directions of both are the same, that is, the line OQ and the tube axis corresponding to each tubular channel are both inclined in the same direction with respect to the main axis B. In some embodiments, when δ=0 and θ=0, this is the structure of the first embodiment referred to FIG. 5, where the tube axis of the tubular channels and the angular bisectors of the annular groove are both located on their respective tangent planes, and the velocity of the gases injected from the peripheral gas delivery assembly 102 includes only a tangential component and an axial component.

While in this embodiment, the velocity of the gases injected by the above-described peripheral gas delivery assembly 102' with inclined tubular channels 1020'-1 and annular groove 1027' includes not only an axial component and a tangential component, but also a radial component. For reaction chambers of different construction ratios and scenarios of use, the introduction of the radial component can further reduce the formation of vortices. In some embodiments, when the annular groove 1027' of the second gas delivery channels 1020' includes several concentric annular grooves (a first concentric annular groove 10271', a second concentric annular groove 10272', and a third concentric annular groove 10273' as shown in FIG. 12), in order to reduce the impact on the internal gas phase reaction region, the velocity of gases injected from the innermost concentric annular groove (that is the first concentric annular groove 10271') of the annular groove 1027' and the corresponding tubular channels 1020'-1 does not include a radial component.

Third Embodiment

This embodiment also provides a gas delivery assembly for a gas-phase reaction apparatus (for example, a vapor deposition apparatus). Referring to FIG. 1, the gas-phase reaction apparatus includes a reaction chamber 200 in which a susceptor 201 is disposed, and the gas delivery assembly 100 is disposed facing the susceptor 201 (e.g., a bottom surface of the gas delivery assembly 100 faces a top surface of the susceptor 201) for delivering process gases into the reaction chamber 200. In this embodiments, the peripheral gas delivery assembly 102 in the gas delivery assembly 100 includes several second gas delivery channels 1020 for delivering the second gas, which could be one or more of purge gases, carrier gases, and reaction source gases, each of the second gas delivery channels 1020 also includes a plurality of tubular channels and one or more annular grooves wherein the at least one annular groove is in fluid communication with the tubular channels to allow gases outflow from the tubular channels. In some embodiments, the tubular channels and annular grooves are respectively the tubular channels 1020-1 and annular grooves 1027 described in the first embodiment; In some embodiments, the tubular channels and annular grooves are respectively the tubular channels 1020'-1 and annular grooves 1027' described in the second embodiment; In some embodiments, some of the tubular channels are parallel to the main axis B, and the remaining tubular channels and the annular grooves are respectively the tubular channels 1020-1 and annular grooves 1027 described in the first embodiment; In some embodiments, some of the tubular channels are parallel to the main axis B, and the remaining tubular channels and the annular grooves are respectively the tubular channels 1020'-1 and annular grooves 1027' described in the second embodiment; In some embodiments, some of the tubular channels are parallel to the main axis B, some of the tubular channels and annular grooves are respectively the tubular channels 1020-1 and annular grooves 1027 described in the first embodiment, and the remaining tubular channels and annular grooves are respectively the tubular channels 1020'-1 and annular grooves 1027' described in the second embodiment. The specific type of the second gas delivery channels can be determined according to different gas-phase reaction apparatuses, use scenarios, and process requirements.

Fourth Embodiment

This embodiment also provides a gas delivery assembly for a gas-phase reaction apparatus (for example, a vapor deposition apparatus). Referring to FIG. 1, the gas-phase reaction apparatus includes a reaction chamber 200 in which a susceptor 201 is disposed, and a gas delivery assembly 100 is disposed facing the susceptor 201 (e.g., a bottom surface of the gas delivery assembly 100 faces a top surface of the susceptor 201) for delivering process gases into the reaction chamber 200. The peripheral gas delivery assembly 102 in the gas delivery assembly of this embodiment includes more than one second gas delivery channels 1020, the structure of which is any one of above embodiments, and the tubular channels 1020-1 in the second gas delivery channel 1020 are distributed in the same manner as in the first embodiment.

In this embodiment, the second gas delivered by the peripheral gas delivery assembly 102 is from the same gas supply terminal, and the second gas delivered by the peripheral gas delivery assembly 102 is regulated in a centralized and unified manner.

Referring to FIG. 1, the gases are supplied to the peripheral gas delivery assembly 102 of the gas delivery assembly 100 by the gas supply terminal 300, so that the types and compositions of the second gas delivered to the reaction chamber 200 by the annular grooves 1027 of the second gas delivery channels 1020 are the same. It should be noted that the second gas delivered from the second gas delivery channels 1020 into the reaction chamber 200 is either a single type gas or mixture of gases. In this embodiment, exemplarily, for group III-V MOCVD, the second gas may include group V hydride source gases, or carrier gases, or purge gases, or a group V hydride source gases mixed with carrier gases, or group V hydride source gases mixed with purge gases.

A control unit, such as a valve, a mass flow controller, a pressure controller, etc., is also provided between the gas supply terminal 300 and the peripheral gas delivery assembly 102. The control unit regulates all the gases supplied to the peripheral gas delivery assembly 102, so that the types and components of the second gas delivered by the peripheral gas delivery assembly 102 are the same.

Fifth Embodiment

This embodiment also provides a gas delivery assembly, which differs from the Forth Embodiment in that: the second gas delivered by the peripheral gas delivery assembly 102 in Embodiment 4 is from the same gas supply terminal 300, and the second gas delivered by the peripheral gas delivery assembly 102 is regulated in a centralized and unified manner, so as to the same type of gases is supplied to the peripheral gas delivery assembly 102, while in this embodiment, the peripheral gas delivery assembly is divided into several sub-regions that are independent of each other, and the second gas delivered by at least two of the sub-regions is regulated independent of each other.

Figure 13:
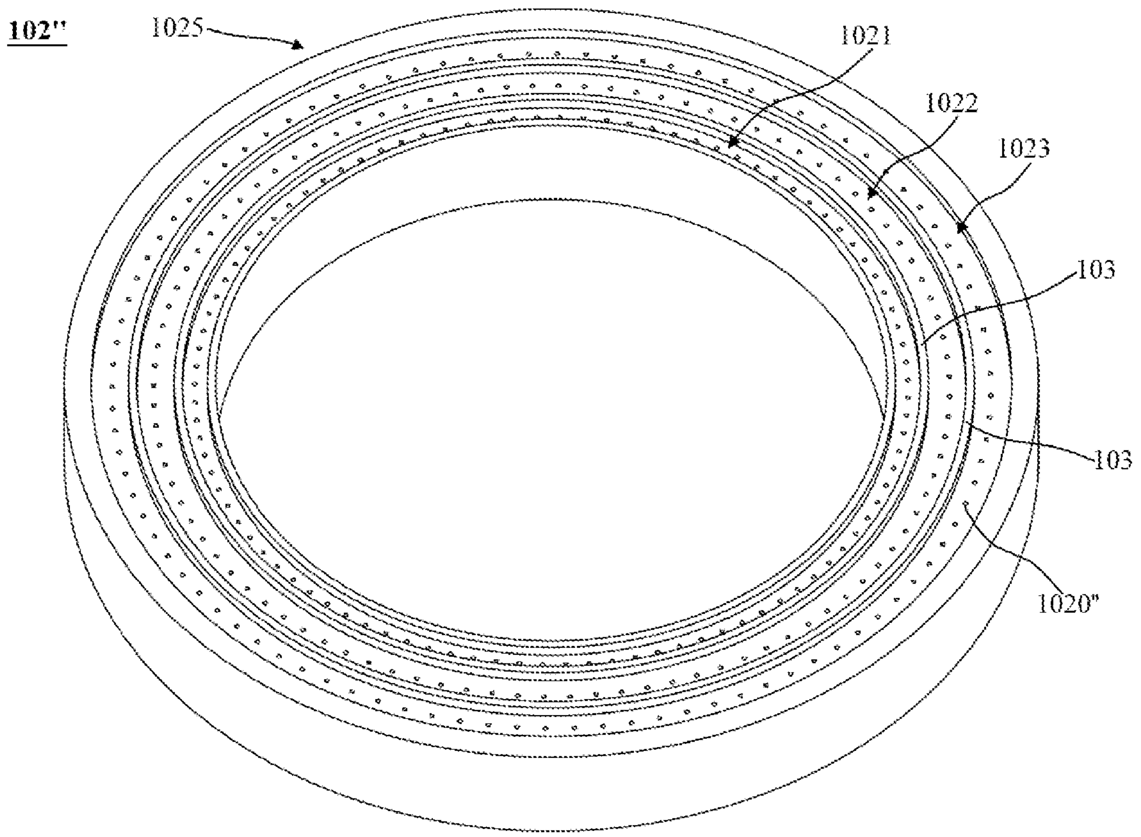
FIG. 13 is a three-dimensional top-view structural diagram of a peripheral gas delivery assembly of the gas delivery assembly according to an embodiment of the present disclosure.

FIG. 13 is a three-dimensional top-view structural diagram of the peripheral gas delivery assembly 102" of this embodiment, in which several second gas delivery channels 1020" are distributed. The peripheral gas delivery assembly 102" of this embodiment is divided into several separate sub-regions by at least one spacer 103.

In some embodiments, the reaction chamber 200 is provided with a top plate overlying the second side 1025 of the peripheral gas delivery assembly 102', and one or more spacers 103 are provided on the top plate; each of the spacers 103 is the ridge extending from the top plate to the second side 1025 of the peripheral gas delivery assembly 102"; that is, when the top plate is mounted on the second side 1025 of the peripheral gas delivery assembly 102", the one or more spacers 103 are between the second side 1025 of the peripheral gas delivery assembly 102" and the top plate, and the one or more spacers 103 divide the second gas delivery channels 1020" in the peripheral gas delivery assembly 102" into several sub-regions.

Optionally, referring to FIG. 13, each of the spacers 103 is formed on the second side 1025 of the peripheral gas delivery assembly 102", and is the ridge extending from the second side 1025 towards the top plate When the top plate is mounted on the second side 1025 of the peripheral gas delivery assembly 102", the one or more spacers 103 are located between the second side 1025 of the peripheral gas delivery assembly 102" and the top plate, and the one or more spacers 103 divide the second gas delivery channels 1020" in the peripheral gas delivery assembly 102" into several sub-regions.

Referring to FIG. 13, the one or more spacers 103 may be concentric rings that have the same center as the peripheral gas delivery assembly 102", dividing the peripheral gas delivery assembly 102" into at least two concentric annular sub-regions. In some embodiments, each sub-region contains one annular groove. In some embodiments, the second gas delivered by the sub-regions is regulated independent of each other. In some embodiments, the flow rate of gases flowing into an outermost sub-region is not less than that of gases flowing into an innermost sub-region; In some embodiments, the average molecular weight of the gases flowing into the outermost sub-region is not less than that of the gases flowing into the innermost sub-region; In some embodiments, the flow rate of the gases flowing into the outermost sub-region is not less than that of gases flowing into the innermost sub-region, and the average molecular weight of the gases flowing into the outermost sub-region is not less than that of the gases flowing into the innermost sub-region. In some embodiments, from the innermost sub-region to the outermost sub-region, the flow rate of the gases flowing into each of the sub-regions gradually increases; In some embodiments, from the innermost sub-region to the outermost sub-region, the average molecular weight of the gases flowing into each of the sub-regions gradually increases; In some embodiments, the flow rate and the average molecular weight of the gases flowing into each of the sub-regions both gradually increases. In some embodiments, from the innermost sub-region to the outermost sub-region, the flow rate of the gases flowing into each of the sub-regions increases, and at least two adjacent sub-regions have the same flow rate for the gases flowing into them; In some embodiments, the average molecular weight of the gases flowing into each of the sub-regions increases, and at least two adjacent sub-regions have the same average molecular weight for the gases flowing into them; In some embodiments, the flow rate and the average molecular weight of the gases flowing into each of the sub-regions both increases, and at least two adjacent sub-regions have the same average molecular weight and the same flow rate for the gases flowing into them.

Alternatively, the one or more spacers 103 are formed on the peripheral gas delivery assembly 102", extend along a radial direction from an inner edge to an outer edge of the peripheral gas delivery assembly 102", and divide the peripheral gas delivery assembly 102" into at least two sub-regions in the shape of sector rings. In some embodiments, the above at least two sub-regions in the shape of sector rings have the same area.

Exemplarily, the gas delivery assembly 100 is disk-like, and the circular reaction chamber 200 is circular, the one or more spacers 103 are distributed on the peripheral gas delivery assembly 102", and are concentric rings that have the same center as the peripheral gas delivery assembly 102". Referring to FIG. 13, as an example, there are two spacers 103, the two spacers 103 and the sidewalls of the peripheral gas delivery assembly 102" divide the peripheral gas delivery assembly 102" into three sub-regions: a first sub-region 1021, which is radially the innermost, a second sub-region 1022, surrounding the first sub-region 1021, and a third sub-region 1023, which is radially the outermost, and the three sub-regions correspond to the first concentric annular groove 10271', the second concentric annular groove 10272', and the third concentric annular groove 10273', respectively. In some embodiments, each of the first sub-region 1021, the second sub-region 1022, and the third sub-region 1023 is in fluid communication with a gas supply terminal 300 that separated from each other. In some embodiments, the gas supply terminal 300 includes several different gas sources, each sub-region is connected to one or more different gas sources, and a control unit, such as a valve, a mass flow controller, a pressure controller, etc., is arranged between each sub-region and each of the gas sources connected to this sub-region. The control units separately control the gases flowing into each of the sub-region, so that the parameters such as compositions and flow rates of gases flowing into the first sub-region 1021, the second sub-region 1022, and the third sub-region 1023 can be the same or different. The above-mentioned parameters can be independently controlled, that is, the flow rate or composition of the gases flowing into each of the first sub-region 1021, the second sub-region 1022, and the third sub-region 1023 can be individually controlled. This increases the controllability of the gases flowing into the reaction chamber 200 through the peripheral gas delivery assembly 102", achieving a better effect of suppressing or eliminating vortices in the reaction chamber.

In some embodiments, the first sub-region 1021 and the second sub-region 1022 are connected to the same gas source and are regulated by the same control unit, and the third sub-region 1023 is connected to another gas source and individually regulated by another control unit. There are other applicable arrangements, as long as the gases flowing into different sub-regions can be individually regulated.

Referring to FIG. 13, the flow rates of the second gas injected by the first sub-region 1021, the second sub-region 1022, and the third sub-region 1023 are F1, F2, and F3, respectively, and the average molecular weights of the second gas injected by the first sub-region 1021, the second sub-region 1022, and the third sub-region 1023 are M1, M2, and M3, respectively, where $F1 \leq F2 \leq F3$, or $M1 \leq M2 \leq M3$, or $F1 \leq F2 \leq F3$ and $M1 \leq M2 \leq M3$.

In the reaction chamber 200, as it gets closer to the internal gas phase reaction region, the need for fine-tuned gas flow adjustment increases. The design of the sub-regions described earlier helps minimize the impact on the internal gas phase reaction region's gas flow, which facilitates a uniform gas injection into the reaction chamber 200, leading to improved suppression and elimination of vortices, and enhanced overall utilization rate of the process gases.

Sixth Embodiment

This embodiment provides a gas-phase reaction apparatus, referring to FIG. 1. The gas-phase reaction apparatus includes a reaction chamber 200, in which a susceptor 201 is disposed, and the susceptor 201 rotates at a speed higher than 200 rpm during reaction. The gas-phase reaction apparatus also includes a gas delivery assembly 100 disposed facing to the susceptor 201. In this embodiment, the gas delivery assembly 100 is any one of that in the above embodiments. The gas-phase reaction apparatus can reduce and suppress the generation of gas vortices, and obtain a uniform and stable gas flow field, thereby expanding the usable range of process parameters and improving the utilization rate of process gases. Therefore, the operation cost of the gas-phase reaction apparatus can be effectively reduced.

The above-mentioned embodiments are merely illustrative of the principle and effects of the present disclosure instead of restricting the scope of the present disclosure. Any person skilled in the art may modify or change the above embodiments without violating the principle of the present disclosure. Therefore, all equivalent modifications or changes made by those who have common knowledge in the art without departing from the spirit and technical concept disclosed by the present disclosure shall be still covered by the claims of the present disclosure.

The invention claimed is:

1. A gas delivery assembly for a gas-phase reaction apparatus, wherein the gas-phase reaction apparatus includes a susceptor, wherein the gas delivery assembly includes an internal gas delivery assembly located in a central region of the gas delivery assembly and a peripheral gas delivery assembly surrounding the central region, wherein the peripheral gas delivery assembly includes a plurality of tubular channels and at least one annular groove in fluid communication with the tubular channels to allow gas outflow from the tubular channels, and an opening side of the at least one annular groove is a gas outlet side, which faces the susceptor, wherein a main axis of the gas delivery assembly is perpendicular to a plane containing the gas outlet side and passes through a geometric center of a gas outlet surface of the gas delivery assembly, a tube axis of each of the tubular channels intersects the annular groove at a point O, respectively, wherein a tangent plane is defined at the corresponding point O of each of the tubular channels with respect to the main axis, wherein for at least one of the tubular channels, there exists a non-zero angle $\varphi$ between the main axis and a projection of its tube axis on the corresponding tangent plane at the point O, so that the gas outflow from the peripheral gas delivery assembly constitutes a rotary gas flow, and a rotation direction of the rotary gas flow is the same as a rotation direction of the susceptor during reaction;

wherein a cross section of the annular groove along a thickness direction of the peripheral gas delivery assembly is triangular, trapezoidal, or arcuate;

wherein gases delivered by the internal gas delivery assembly are through a first gas supply terminal, and include reaction source gases and carrier gases to generate a target product, wherein gases delivered by the peripheral gas delivery assembly are through a second gas supply terminal different than the first gas supply terminal, and are one or more of purge gases, carrier gases, and reaction source gases, wherein different types of gases delivered by the peripheral gas delivery assembly do not react with each other, or the different types of gases delivered by the peripheral gas delivery assembly react with each other but do not generate the target product;

wherein for each point O, a straight line parallel to the main axis and passing through the point O is defined as an axial line OO' of the point O, and a plane containing the main axis and the axial line OO' is defined as a plane P0, and a plane containing the tube axis corresponding to the point O and the axial line OO' is defined as a vertical plane of the tube axis corresponding to the point O; wherein for at least one tube axis of the tubular channels, there exists an angle $\theta$ between the vertical plane corresponding to the tube axis and the tangent plane at the point O, and of the at least one annular groove, the one where the point O is located intersects with the plane containing the gas outlet side, forming a first intersection line and a second intersection line, wherein the first intersection line intersects with the plane P0 at a point M, the second intersection line intersects with the plane P0 at a point N, an angle $\gamma$ is formed between lines OM and ON, an angular bisector of the angle $\gamma$ is defined as a line OQ, and an angle $\delta$ is formed between the line OQ and the axial line OO';

wherein the at least one annular groove includes several concentric annular grooves; for tubular channels communicated with an innermost concentric annular groove of the several concentric annular grooves, the angle $\delta$ and the angle $\theta$ are zero; for tubular channels other than those communicated with the innermost concentric annular groove, at least one of the angle $\delta$ and the angle $\theta$ is not zero.

2. The gas delivery assembly according to claim 1, wherein the cross section of the annular groove along the thickness direction of the peripheral gas delivery assembly is triangular.

3. The gas delivery assembly according to claim 1, wherein the tubular channels are distributed along several concentric annular regions, a quantity of the concentric annular grooves is less than or equal to that of the concentric annular regions, and each of the concentric annular grooves is arranged corresponding to at least one of the concentric annular regions and communicates with the tubular channels in the corresponding at least one concentric annular region.

4. The gas delivery assembly according to claim 3, wherein from the innermost concentric annular region to the outermost concentric annular region, the quantity of the tubular channels in each of the concentric annular regions gradually increases.

5. The gas delivery assembly according to claim 3, wherein the opening width of an outermost concentric annular groove is greater than that of the innermost concentric annular groove, or from the innermost concentric annular groove to the outermost concentric annular groove, the opening width of each of the concentric annular grooves gradually increases.

6. The gas delivery assembly according to claim 1, wherein at least some of the tubular channels have the same angle φ.

7. The gas delivery assembly according to claim 3, wherein the concentric annular grooves correspond one-to-one with the concentric annular regions, and each of the tubular channels in the same concentric annular region has the same angle φ.

8. The gas delivery assembly according to claim 7, wherein the angle φ of the tubular channels in an outermost concentric annular region is not smaller than that of an innermost concentric annular region, or from the innermost concentric annular region to the outermost concentric annular region, the angle q of the tubular channels in each of the concentric annular regions gradually increases.

9. The gas delivery assembly according to claim 1, wherein the line OQ and the tube axis are both inclined in the same direction with respect to the main axis.

10. The gas delivery assembly according to claim 1, wherein gases delivered by the peripheral gas delivery assembly are from a same gas supply terminal, and the gases delivered by the peripheral gas delivery assembly are regulated in a centralized and unified manner.

11. The gas delivery assembly according to claim 1, wherein the gas delivery assembly further includes at least one spacer that divides the peripheral gas delivery assembly into several sub-regions that are independent of each other, and gases delivered by at least two of the sub-regions are regulated independent of each other; wherein each of the at least two of the sub-regions is connected to a different one of several gas sources, and a control unit including a valve, a mass flow controller, or a pressure controller is arranged between each of the sub-regions and a corresponding one of the gas sources connected to said sub-region.

12. The gas delivery assembly according to claim 11, wherein the sub-regions are concentric annular, a flow rate of gases flowing into an outermost sub-region is not less than that of gases flowing into an innermost sub-region, and/or an average molecular weight of the gases flowing into the outermost sub-region is not less than that of gases flowing into the innermost sub-region.

13. The gas delivery assembly according to claim 11, wherein the sub-regions are concentric annular, and from an innermost sub-region to an outermost sub-region, a flow rate and/or average molecular weight of gases flowing into each of the sub-regions gradually increases.

14. The gas delivery assembly according to claim 1, wherein the peripheral gas delivery assembly covers outer regions of the susceptor and an area of the susceptor covered by the peripheral gas delivery assembly does not exceed 36% of a total area of the susceptor.

15. The gas delivery assembly of claim 1, wherein the peripheral gas delivery assembly is located on the outside of the susceptor, and the susceptor is not covered at all by the peripheral gas delivery assembly.

16. A gas-phase reaction apparatus, comprising:

a reaction chamber;

a susceptor, disposed within the reaction chamber, wherein a rotation speed of the susceptor during reaction is higher than 200 rpm; and the gas delivery assembly according to claim 1, disposed facing the susceptor.

* * * * *